United States Patent
Chang et al.

(10) Patent No.: US 9,718,677 B1
(45) Date of Patent: Aug. 1, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Yi-Hsien Chang, Changhua County (TW); Chun-Ren Cheng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/000,521

(22) Filed: Jan. 19, 2016

(51) Int. Cl.
   *H01L 29/84* (2006.01)
   *B81C 1/00* (2006.01)
   *B81B 3/00* (2006.01)

(52) U.S. Cl.
   CPC ........ *B81C 1/00158* (2013.01); *B81B 3/0021* (2013.01); *B81B 2201/0257* (2013.01); *B81B 2203/0127* (2013.01); *B81B 2203/0315* (2013.01); *B81B 2207/012* (2013.01); *B81B 2207/07* (2013.01)

(58) Field of Classification Search
   CPC .................... B81B 3/0021; B81C 1/00158
   See application file for complete search history.

(56) References Cited

U.S. PATENT DOCUMENTS

| | | | | |
|---|---|---|---|---|
| 2002/0181725 A1* | 12/2002 | Johannsen | ............. | B82Y 30/00 381/174 |
| 2013/0161702 A1* | 6/2013 | Chen | ................... | B81C 1/00246 257/254 |
| 2013/0187245 A1* | 7/2013 | Chien | ................. | B81C 1/00269 257/415 |
| 2013/0264663 A1* | 10/2013 | Dehe | .................... | H04R 19/005 257/416 |
| 2013/0285170 A1* | 10/2013 | Lin | ..................... | B81C 1/00269 257/415 |
| 2013/0334626 A1* | 12/2013 | Weber | ................... | B81B 3/0018 438/51 |
| 2014/0270272 A1* | 9/2014 | Peng | .................... | H04R 31/006 381/174 |
| 2015/0102390 A1* | 4/2015 | Liu | ........................ | H01L 27/092 257/254 |
| 2015/0194409 A1* | 7/2015 | Chuang | ............... | H01L 25/0657 257/737 |
| 2016/0112807 A1* | 4/2016 | Yuan | ..................... | H04R 19/04 381/174 |

* cited by examiner

*Primary Examiner* — Trung Q Dang
*Assistant Examiner* — Wasiul Haider
(74) *Attorney, Agent, or Firm* — WPAT, P.C., Intellectual Property Attorneys; Anthony King

(57) ABSTRACT

In the present disclosure a semiconductor device comprises a plate including a plurality of apertures. The semiconductor device also comprises a membrane disposed opposite to the plate and including a plurality of corrugations, a dielectric surrounding and covering an edge of the membrane, and a substrate. The semiconductor device further includes a metallic conductor comprising a first portion extending through the dielectric, and a second portion over the substrate, where the second portion is bonded with the first portion.

20 Claims, 24 Drawing Sheets

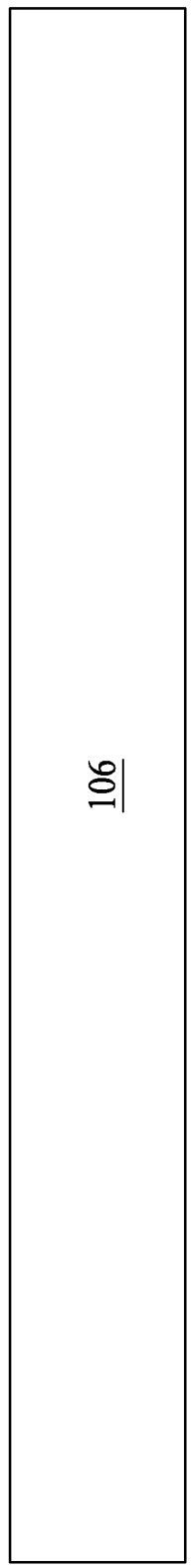

SEMICONDUCTOR STRUCTURE AND MANUFACTURING METHOD THEREOF

BACKGROUND

Electronic equipment involving semiconductive devices are essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is a micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. MEMS devices are widely used in various applications. MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications are extended to optical applications, such as movable mirrors, and radio frequency (RF) applications, such as RF switches or the like.

As technologies evolve, designs for devices become more complicated in view of smaller dimension and an increase of functionality and the amount of circuitries. The devices involve many complicated steps and increases complexity of manufacturing, and the increase in complexity of manufacturing may cause deficiencies such as high yield loss, warpage, low signal to noise ratio (SNR) and other problems. Therefore, there is a continuous need to modify the structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-5I are cross-sectional views of intermediate structures for a method of manufacturing a semiconductor structure in FIG. 4, in accordance with some embodiments.

DETAILED DESCRIPTION OF THE DISCLOSURE

Figure 1:
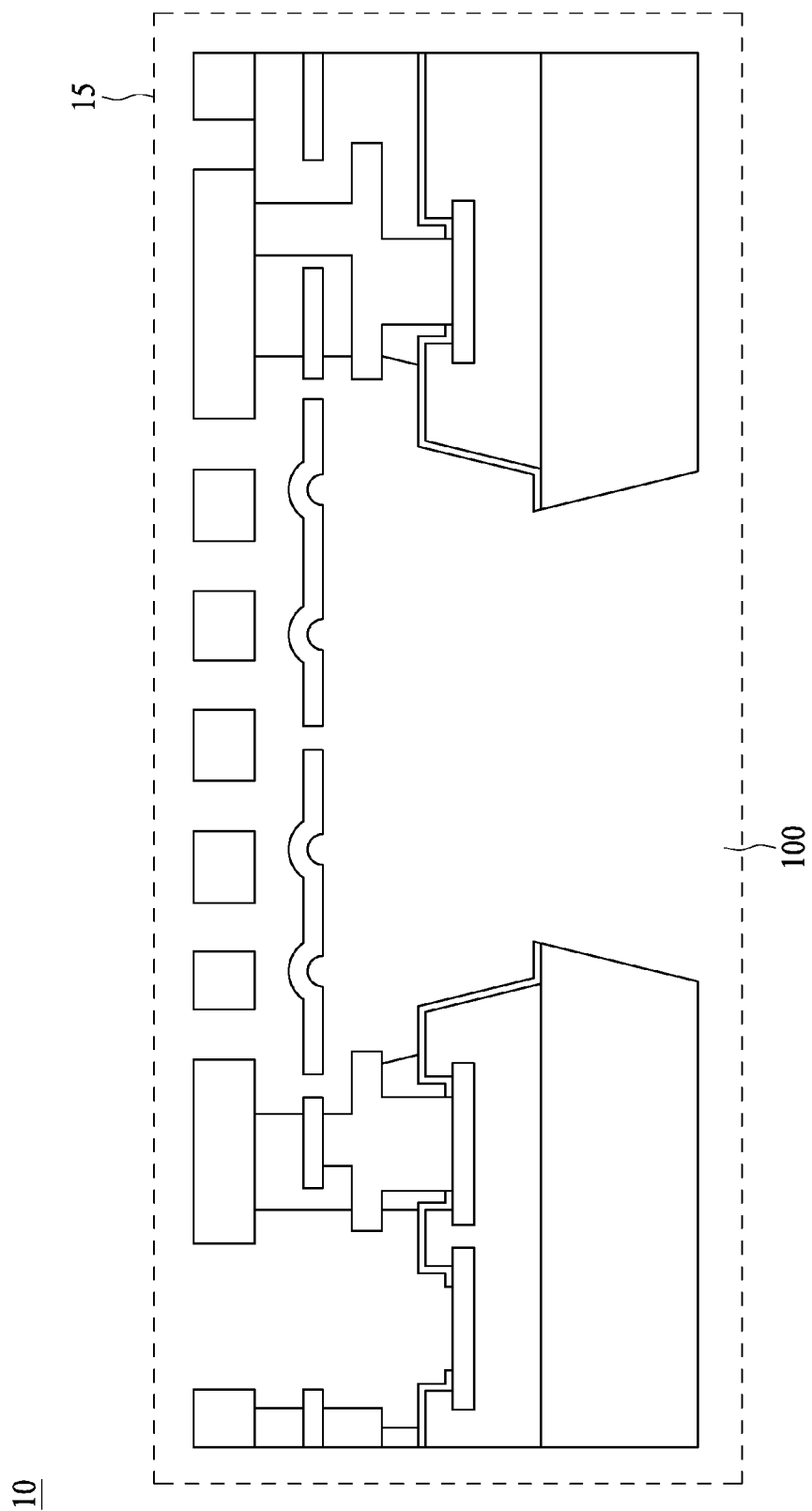
FIG. 1 is a schematic view of a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a semiconductor structure is disclosed. The semiconductor structure includes a MEMS device. The MEMS device includes a plate and a membrane. The plate is stationary while the membrane is moveable relative to the plate in response to ambient environment change such as acoustic pressure. In some embodiments, the semiconductor structure is a microphone and responds as sound wave striking on the membrane. The plate of the MEMS device includes semiconductive layer. The plate would not have undesired bending and a straightness of the plate can be maintained during manufacturing or during use. Thus, a noise is reduced, the SNR is increased.

Furthermore, the plate and the membrane are supported by a handle substrate (such as silicon substrate) during formation of the plate and the membrane. A thickness of the handle substrate is much greater than a thickness of the plate and the membrane. The handle substrate would be thinned down and partially removed after formation of the plate and the membrane and bonding with another substrate such as CMOS substrate. As a result, an overall thickness of the device is reduced. A form factor of the microphone is also reduced.

FIG. 1 is a schematic perspective view of a semiconductor structure 10 in accordance with some embodiments of the present disclosure. Semiconductor structure 10 includes a housing 15 enclosing a MEMS device 100. Housing 15 is depicted in a dotted line. There may be some apertures on housing 15 so as to provide channels for MEMS device 100 communicating with environment external to housing 15. In some embodiments, semiconductor structure 10 is configured to sense an atmospheric pressure. In some embodiments, semiconductor structure 10 is configured to sense an acoustic pressure such as sound wave. In some embodiments, semiconductor structure 10 is a part of a microphone. The acoustic pressure is received by MEMS device 100 and then is converted into an electrical signal. In some embodiments, MEMS device 100 has a thickness of about less than 100 um. In some embodiments, MEMS device 100 has a thickness of less than about 2 um. In some embodiments, MEMS device 100 is disposed over and bonded with another substrate. In some embodiments, MEMS device 100 includes an anti-stiction coating structures.

Figure 2:
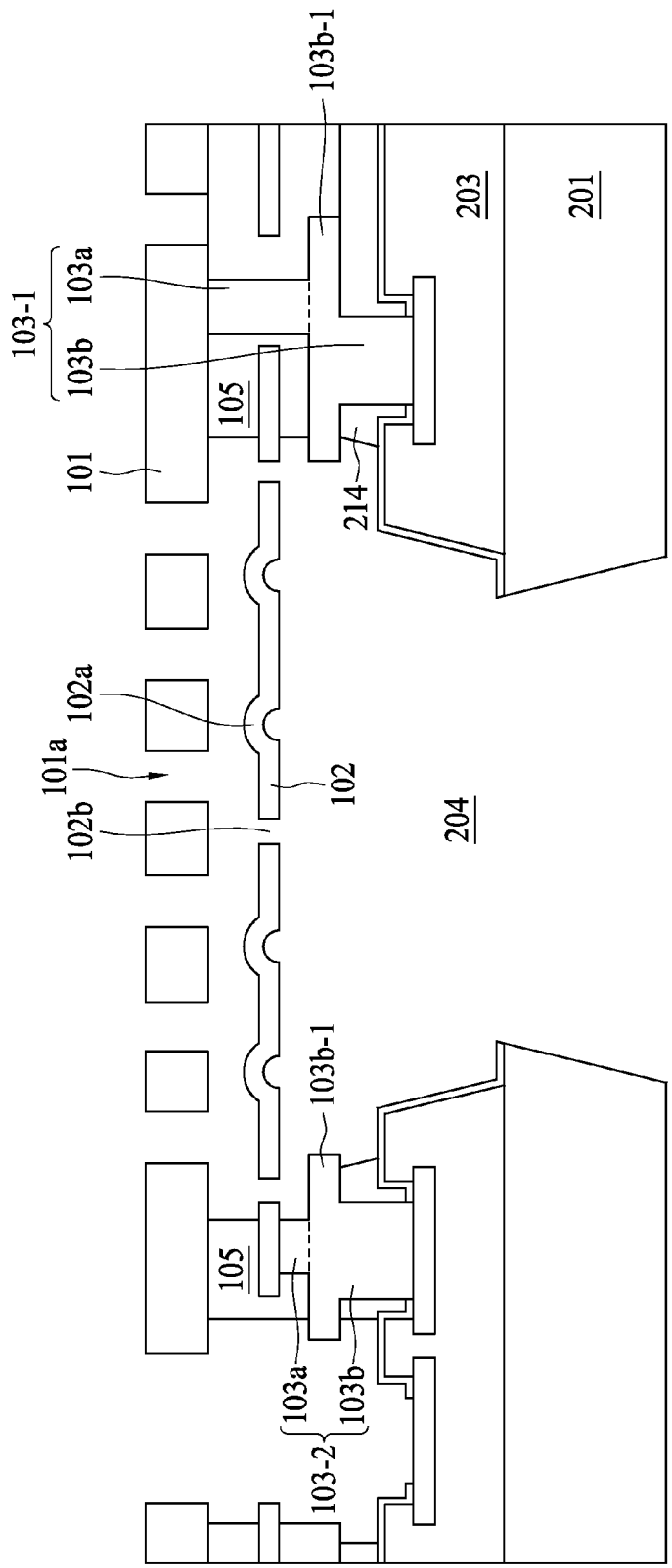
FIG. 2 is a schematic view of a semiconductor structure in accordance with some embodiments.

MEMS device 100 is further illustrated in FIG. 2. MEMS device 100 includes a plate 101, a membrane 102 and several conductors 103 (103-1 or 103-2). Conductor 103 can be disposed between a substrate 201 and plate 101 as conductor 103-1, or can be disposed between substrate 201 and membrane 102 as conductor 103-2. Plate 101 is a stationary element and served as a back plate of MEMS device 100. Plate 101 is not movable by the acoustic pressure received by MEMS device 100. In some embodiments, plate 101 is a stiff perforated element which allows the acoustic pressure passing through. In some embodiments, plate 101 has a thickness of about 1 um to about 20 um. In some embodiments, the thickness of the plate 101 is about 0.3 um to about 20 um.

In some embodiments, plate 101 has a small thickness while has sufficient stiffness to resist residual stress developed upon manufacturing and the acoustic pressure striking thereon. In some embodiments, plate 101 has stiffness such that the plate 101 would not be bent when the acoustic pressure is received by MEMS device 100 and passes through plate 101. In some embodiments, plate 101 would not be bent by the stiction caused by membrane 102 disposed opposite to the plate 101. The straightness of plate 101 is maintained.

In some embodiments, plate 101 is doped with suitable dopants to include several doped regions. In some embodiments, plate 101 is doped with a p-type dopant such as boron or an n-type dopant such as phosphorous. In some embodiments, plate 101 uses the same type of dopant to prevent a p-n junction and have better conductivity.

An anti-stiction coating is optionally applied on plate 101 or membrane 102. In some embodiments, the anti-stiction coating is a self-assembled monolayer (SAM) coating which can prevent or reduce stiction between plate 101 and membrane 102. In some embodiments, plate 101 is in circular, rectangular, quadrilateral, triangular, hexagon, or any other suitable shapes. In some embodiments, plate 101 includes a semiconductive layer, an SOI (silicon on insulator), polysilicon, oxide, or epitaxial silicon.

Plate 101 includes several apertures 101a. Each aperture 101a passes through plate 101. In some embodiments, apertures 101a are configured for the acoustic pressure received by the MEMS device 100 to pass through. Apertures 101a can relieve a stress on plate 101 caused by the acoustic pressure, such that plate 101 would not be bent by the acoustic pressure. Furthermore, apertures 101a are configured to prevent membrane 102 from sticking with plate 101 by the acoustic pressure and the stiction between plate 101 and membrane 102.

Apertures 101a are arranged in any suitable patterns. In some embodiments, apertures 101a are arranged in a regular or an irregular array over the plate 101. In some embodiments, aperture 101a is in a circular, quadrilateral, elliptical, triangular, hexagon, or any other suitable shapes. In some embodiments, aperture 101a has a width of about 0.5 um to about 5 um. In some embodiments, a pitch between adjacent apertures 101a is about 1 um to about 100 um. In some embodiments, a total number of the apertures 101a, the pitch between adjacent apertures 101a or the width of each aperture 101a is predetermined and designed, so that plate 101 would not be bent by the acoustic pressure received and the stiction between plate 101 and membrane 102, and the straightness of plate 101 can be maintained.

Membrane 102 is disposed opposite to plate 101. In some embodiments, membrane 102 is disposed between plate 101 and cavity 204. In some embodiments, membrane 102 is disposed away from the plate 101 in a distance of about 0.5 um to about 5 um, or about 0.3 um to about 5 um. In some embodiments, membrane 102 is in circular, rectangular, quadrilateral, triangular, hexagon, or any other suitable shapes. In some embodiments, membrane 102 includes polysilicon. In some embodiments, membrane 102 is conductive and capacitive. In some embodiments, membrane 102 is supplied with a predetermined charge. In some embodiments, membrane 102 includes an anti-stiction coating disposed over membrane 102 to prevent or reduce a stiction between plate 101 and membrane 102. In some embodiments, the anti-stiction coating is a SAM coating. In some embodiments, membrane 102 has a thickness of about 0.1 um to about 5 um.

Membrane 102 is a movable or oscillatable element. Membrane 102 is displaceable relative to plate 101 and is served as a diaphragm. In some embodiments, membrane 102 is configured to sense the acoustic pressure received by the MEMS device 100. When the acoustic pressure is impinged on membrane 102, membrane 102 would be displaced or oscillated corresponding to the acoustic pressure impinged on membrane 102. In some embodiments, a magnitude and/or a frequency of the displacement of membrane 102 corresponds to a volume and/or pitch of the acoustic pressure impinged on membrane 102.

In some embodiments, the displacement of membrane 102 relative to plate 101 would cause a capacitance change between membrane 102 and plate 101. The capacitance change would then be translated into an electrical signal by a circuitry connected with plate 101 and membrane 102. In some embodiments, the acoustic pressure impinging on membrane 102 is converted into the electrical signal representing the acoustic pressure impinged on membrane 102. In some embodiments, the electrical signal generated would be transmitted to another device, another substrate or another circuitry for further processing.

In some embodiments, membrane 102 includes an anti-stiction structure configured to reduce the contact area between membrane 102 and plate 101. Further, the anti-stiction structure may be configured to supply a restoring force on membrane 102 to avoid stiction between plate 101 and membrane 102. For example, membrane 102 includes several corrugations 102a. Corrugations 102a are arranged over membrane 102. In some embodiments, corrugations 102a face to and are opposite to apertures 101a of plate 101. In some embodiments, corrugations 102a are substantially aligned or not aligned with apertures 101a of plate 101. In some embodiments, corrugations 102a are protruded or recessed from a surface of the membrane 102. In some embodiments, corrugation 102a is a groove extending across the surface of plate 101. In some embodiments, corrugation 102a is a protruded portion or a recessed portion of the surface of plate 101. In some embodiments, corrugation 102a is a bump on plate 101.

In some embodiments, corrugations 102a are configured to relieve undesired stress over the membrane 102. In some embodiments, corrugations 102a prevent membrane 102 from sticking with plate 101. In some embodiments, corrugations 102a prevent undesired deflection of membrane 102. Corrugations 102a can facilitate membrane 102 to return to its initial straight configuration after receiving and being bent by the acoustic pressure. When membrane 102 is displaced by the acoustic pressure, membrane 102 would be bent. After the receipt of the acoustic pressure, it is desirable the membrane 102 would be returned to the initial straight configuration.

In some embodiments, corrugation 102a is in a closed loop, a quadrilateral ring, an annular shape, an elliptical shape, a pyramid shape or any other suitable configurations. In some embodiments, corrugation 102a has a width of about 0.1 um to about 10 um. In some embodiments, a pitch between adjacent corrugations 102a is about 1 um to about 200 um. In some embodiments, corrugation 102a is arranged in a nano-scaled structure. In some embodiments, there are a number of corrugations 102a disposed on membrane 102. For example, there are two annular corrugations 102a as illustrated in FIG. 2.

In some embodiments, the shape, the width, the pitch or the number of corrugations 102a is predetermined and designed, so that membrane 102 would not have undesired bending. In some embodiments, the shape, the width or the number of corrugations 102a is chosen to optimize the straightness and the sensitivity of membrane 102. The membrane 102 can sense the acoustic pressure accurately and promptly, and can be returned to the initial straight configuration after sensing the acoustic pressure.

In some embodiments, membrane 102 includes several holes 102b over membrane 102. In some embodiments, holes 102b are configured to relieve undesired stress over membrane 102. In some embodiments, holes 102b can prevent or minimize membrane 102 from sticking with plate 101. In some embodiments, holes 102b are substantially aligned or not aligned with apertures 101a. In some embodiments, a total number of holes 102b is chosen, so that membrane 102 would not have undesired bending. In some embodiments, a total number of holes 102b is less than a total number of apertures 101a over plate 101. In some embodiments, the total number of the holes 102b is chosen to optimize the straightness and the sensitivity of membrane 102. Membrane 102 can sense the acoustic pressure accurately and promptly, and can be returned to the initial straight configuration after sensing the acoustic pressure. Also, membrane 102 can be prevented from sticking with plate 101 by stiction.

Plate 101 or membrane 102 is electrically communicating with substrate 201 through conductor 103. In addition to electrical communication, conductor 103 also provides mechanical support to plate 101 or membrane 102. In some embodiments, conductor 103 has a height from plate 101 of about 5 um to about 20 um. In some embodiments, conductor 103 has a height from the membrane 102 of about 2 um to about 20 um. Each conductor 103 has at least two different portions. A first portion 103a and a second portion 103b constitute conductor 103. First portion 103a and second portion 103b may include a same conductive or semiconductive material such as gold, tin, silicon, tin, copper, tin copper alloy (SnCu) or other suitable materials. In some embodiments, first portion 103a and second portion 103b includes metal like copper, silver, or gold. First portion 103a is bonded with second portion 103b, for example, in a metal-to-metal bonding manner. Because atoms from each side may be fused during bonding operation, the interface between first portion 103a and second portion 103b may not be easy to be observed under optical microscope. However, some surface treatments, such as chemical stain or plasma bombardment can be applied on a cross section of conductor 103. Seams or voids along the interface may be observed under a higher magnitude microscope such as SEM (Scanning Electron Microscope) or TEM (Transmission Electron Microscope).

In some embodiments, first portion conductor 103a is adjacent to a dielectric 105. A sidewall of first portion 103a is substantially extended along the thickness of dielectric 105. Dielectric 105 is disposed under plate 101 and configured to provide mechanical support to plate 101 or membrane 102. In some embodiments, first portion 103a is surrounded by dielectric 105 as conductor 103-1. In some embodiments, a sidewall of first portion 103a is partially exposed from dielectric 105. As illustrated in conductor 103-2, one side of first portion 103a is in contact with dielectric 105 and the opposite side is exposed to cavity 204. First portion 103a can be a barrier to block chemicals from cavity 204 penetrating into dielectric 105.

Compared to first portion conductor 103a, second portion conductor 103b is proximal to substrate 201. Second portion conductor 103b is extended from an interconnect 203. Interconnect 203 and substrate 201 together form a semiconductor device. In some embodiments, interconnect 203 includes conductive traces, vias, or inter metallic dielectric. Substrate 201 includes doped semiconductor wells, regions, and transistor gates. Interconnect 203 provides backend connection for devices built in substrate 201. Plate 101 or membrane 102 are communicating with substrate 201 through interconnect 203. A conductive pad 202 may be disposed on an upmost level of interconnect 203 as a terminal to communicate with plate 101 or membrane 102. Second portion conductor 103b is extended from pad 202 and along the direction in which plate 101 is stacked over substrate 201. Conductive pad 202 may include copper, silver, gold, aluminum, or alloy thereof.

Alternatively, second portion conductor 103b is surrounded by a dielectric 214. Dielectric 214 is disposed between first portion conductor 103a and interconnect 203. Second portion conductor 103b is further exposed from dielectric 214 and has a section 103b-1 overlying dielectric 214. The overlying section 103b-1 is in contact with first portion conductor 103a as shown in FIG. 2. The overlying section 103b-1 is a conductive layer inserted between dielectric 214 and dielectric 105. However, for some other embodiments, there is no overlying section in second portion conductor 103b. Second portion conductor 103b is like a plug in dielectric 214 with only one end exposed from dielectric 214. The exposed end is in contact with first portion conductor 103a.

Figure 3:
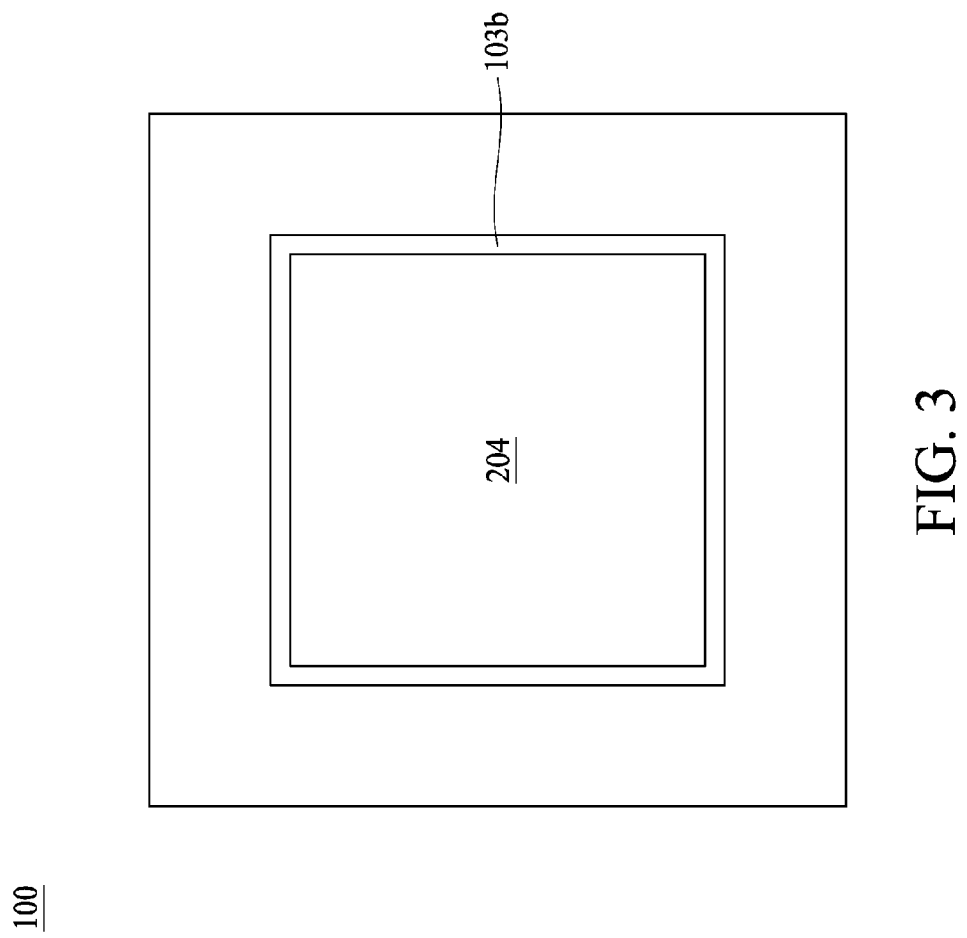
FIG. 3 is a top view of the semiconductor structure in FIG. 2 in accordance with some embodiments.

In some embodiments, second portion conductor 103b is in a loop shape. Referring to FIG. 3, the drawing is a top view of MEMS device 100 in FIG. 2. Second portion conductor 103b is a loop and cavity 204 is defined inside the loop. Through conductor 103, MEMS structures like plate 101 and membrane 102 are integrated with the device in substrate 201. Without extra wire bonding feature included, the size of monolithic MEMS device 100 can be shrunk and the thickness can reduced to be below 200 um.

Referring back to FIG. 2, dielectric 105 may be disposed on an edge of membrane 102 or an edge of plate 101. Dielectric 105 forms a continuous stiff structure between plate 101 and membrane 102. In some embodiments, membrane 102 is clamped at its edges by dielectric 105. In some embodiments dielectric 105 is disposed around conductor 103 and a peripheral portion of membrane 102. Alternatively, dielectric 105 may surround membrane 102. Dielectric 105 provides partial isolation between plate 101, membrane 102, and conductor 103 from each other. In some embodiments, dielectric 105 is disposed over a peripheral portion of plate 101 or surrounds plate 101. In some embodiments, dielectric 105 is disposed between plate 101 and a device substrate 106 (would be shown later). A thickness of dielectric 105 may be about 1 um to about 20 um.

Figure 4:
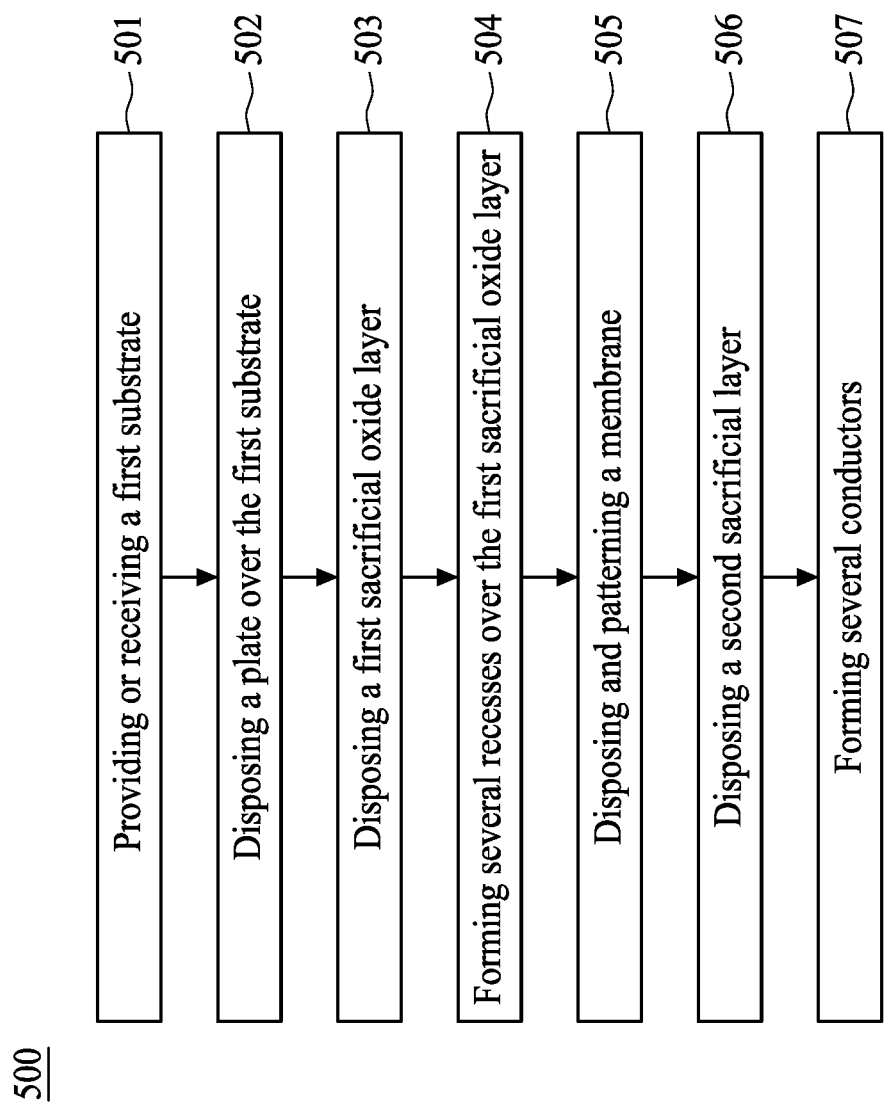
FIG. 4 is a flow diagram of a method of manufacturing a semiconductor structure in accordance with some embodiments.

In the present disclosure, a method 500 of manufacturing a semiconductor device like MEMS device 100 of FIG. 2 is disclosed. The method includes a number of operations and the description and illustration are not deemed as a limitation as the sequence of the operations. FIG. 4 is an embodiment of method 500 for manufacturing a portion of MEMS device 100. Method 500 includes a number of operations (501, 502, 503, 504, 505, 506, 507).

Figure 5B:
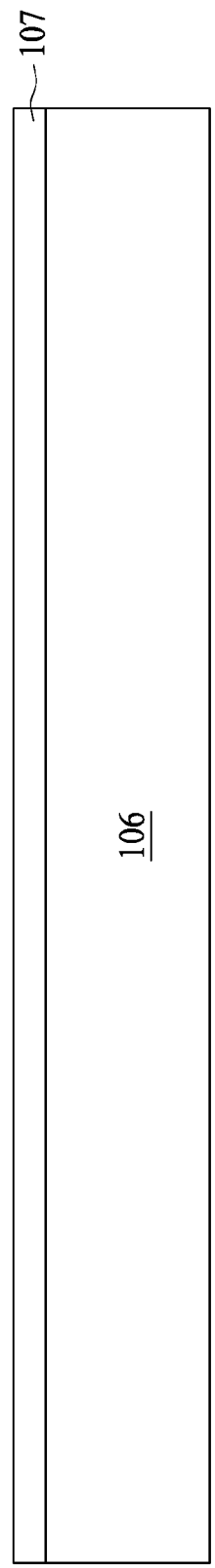

In operation 501, a first substrate 106 is received or provided as shown in FIGS. 5A and 5B. In some embodiments, first substrate 106 is a handle substrate or a handle wafer. In some embodiments, first substrate 106 includes silicon. In some embodiments, first substrate 106 is a silicon substrate. First substrate 106 has a thickness of about 400 um to about 1000 um.

Figure 5C:
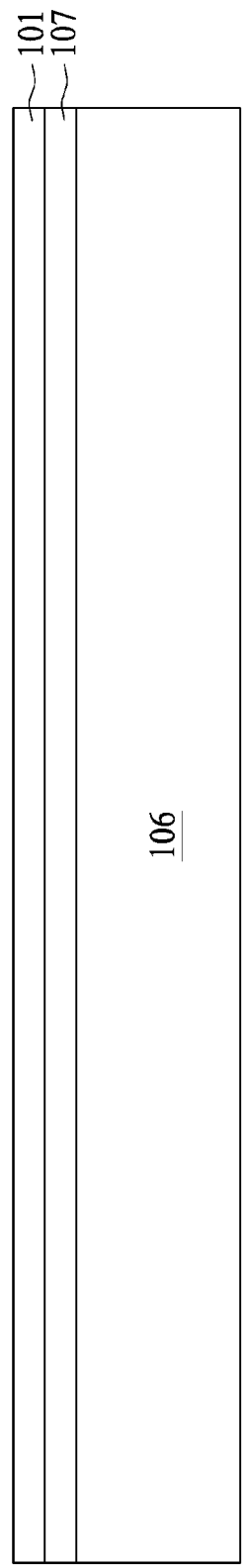

In FIG. 5B, a layer 107 is disposed over first substrate 106 with reference to operation 502. In some embodiments, layer 107 includes an epitaxial silicon layer, silicon on insulator (SOI), or any other suitable materials. In some embodiments, a thickness of layer 107 is about 1 um to about 5 um. Layer 107 has an etch selectivity with first substrate 106. Then, first plate 101 is disposed over first substrate 106 and layer 107 as shown in FIG. 5C. In some embodiments, first plate 101 is bonded silicon with thickness of about 5 um to about 50 um.

Figure 5D:
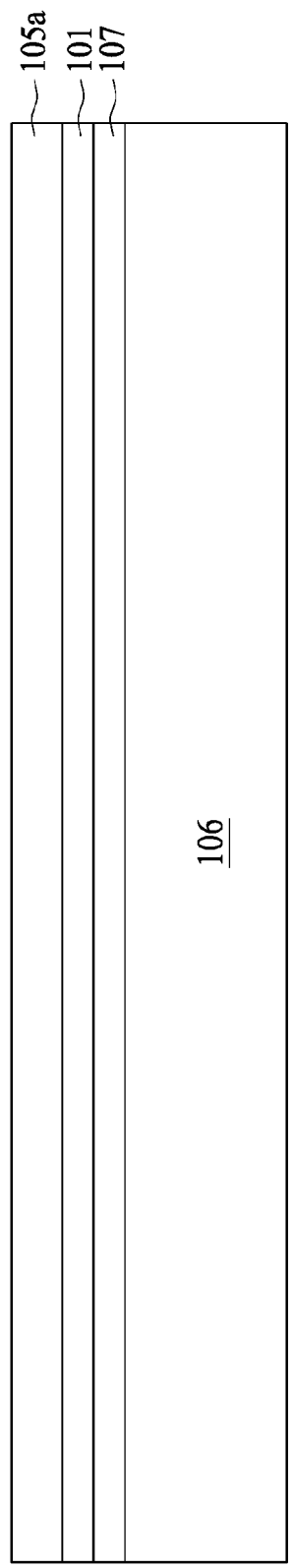

In operation 503, a first sacrificial layer 105a is disposed over plate 101 as shown in FIG. 5D. In some embodiments, first sacrificial layer 105a is disposed by any suitable deposition techniques such as chemical vapor deposition (CVD) and the like. In some embodiments, first sacrificial layer 105a includes dielectric material such as silicon oxide. In some embodiments, first sacrificial layer 105a has a thickness of about 0.3 um to about 5 um. In some embodiments, first sacrificial layer 105a has a thickness of about 0.3 um to about 10 um.

Figure 5E:
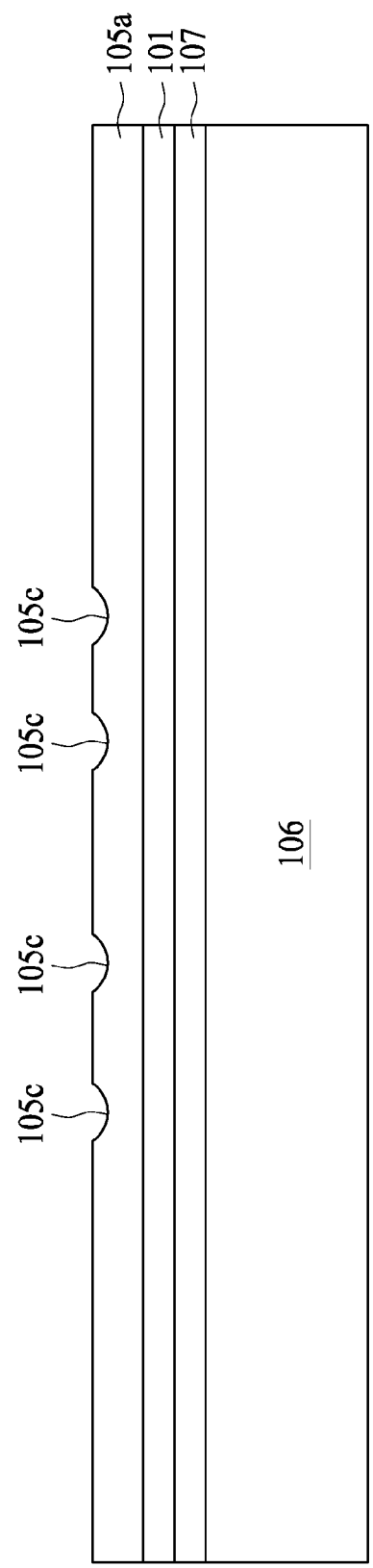

In operation 504, several recesses 105c are formed over a surface of the sacrificial layer 105a as shown in FIG. 5E. In some embodiments, recesses 105c are indented from the surface of first sacrificial layer 105a. In some embodiments, some portions of first sacrificial layer 105a are removed from the surface to form the recesses 105c. In some embodiments, recesses 105c are formed by photolithography and wet or dry etching operations.

Figure 5F:
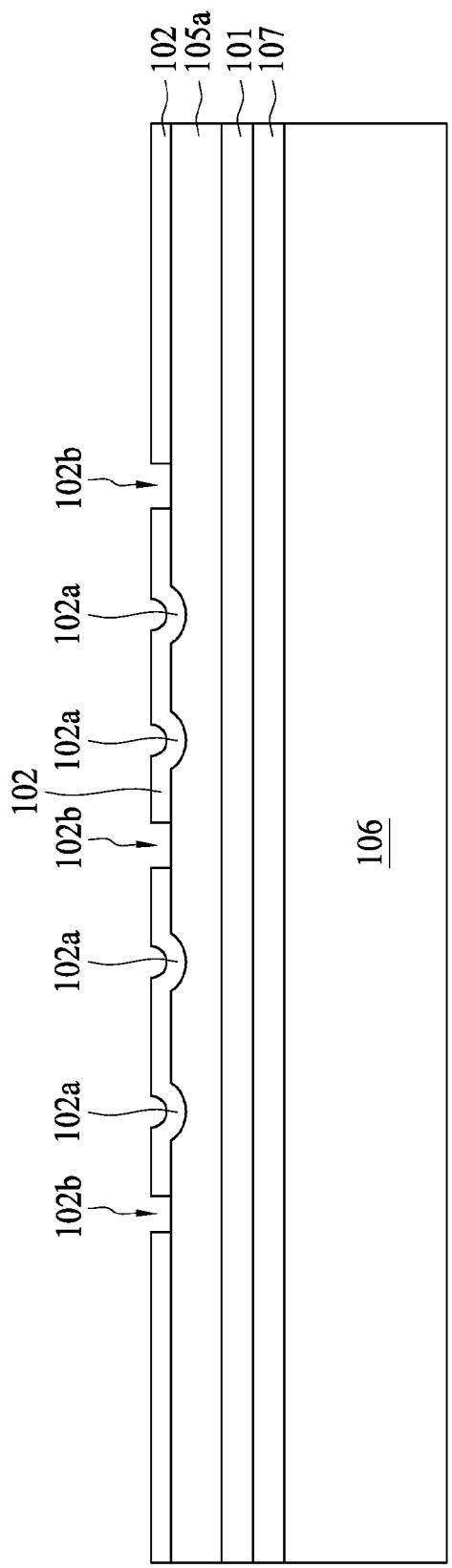

In operation 505, membrane 102 is disposed and then patterned over first sacrificial layer 105a as shown in FIG. 5F. In some embodiments, membrane 102 is disposed over the first sacrificial layer 105a by any suitable deposition operations. In some embodiments, the membrane 102 includes polysilicon. In some embodiments, membrane 102 is doped with any suitable dopants. In some embodiments, membrane 102 has a thickness of about 0.1 um to about 5 um.

In some embodiments, membrane 102 is patterned by photolithography and etching operations after the deposition operations, so that several corrugations 102a and several holes 102b are formed over the membrane 102. In some embodiments, some portions of membrane 102 are removed to form the holes 102b. The holes 102b expose a portion of first sacrificial layer 105a.

Figure 5G:
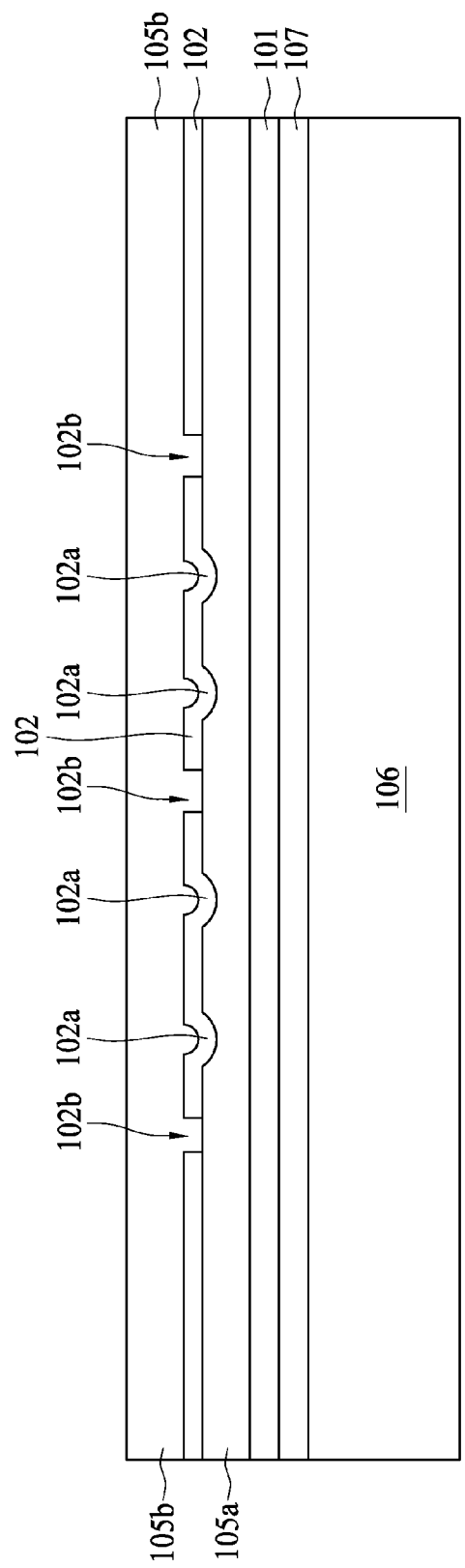

In operation 506, a second sacrificial layer 105b is disposed over a portion of first sacrificial layer 105a (exposed through holes 102b) and surrounds membrane 102 as shown in FIG. 5G. In some embodiments, second sacrificial layer 105b covers first sacrificial layer 105a. In some embodiments, second sacrificial layer 105b is disposed over membrane 102 and first sacrificial layer 105a by any suitable deposition operations. In some embodiments, second sacrificial layer 105b includes same or different materials as first sacrificial layer 105a. In some embodiments, second sacrificial layer 105b includes dielectric material such as silicon oxide. In some embodiments, second sacrificial layer 105b has a thickness of about 0.3 um to about 5 um. In some embodiments, second sacrificial layer 105b has a thickness of about 0.3 um to about 10 um. In some embodiments, second sacrificial layer 105b is planarized to a reduced height than as deposited. In some embodiments, second sacrificial layer 105b is polished by chemical mechanical polishing (CMP) operations.

Figure 5H:
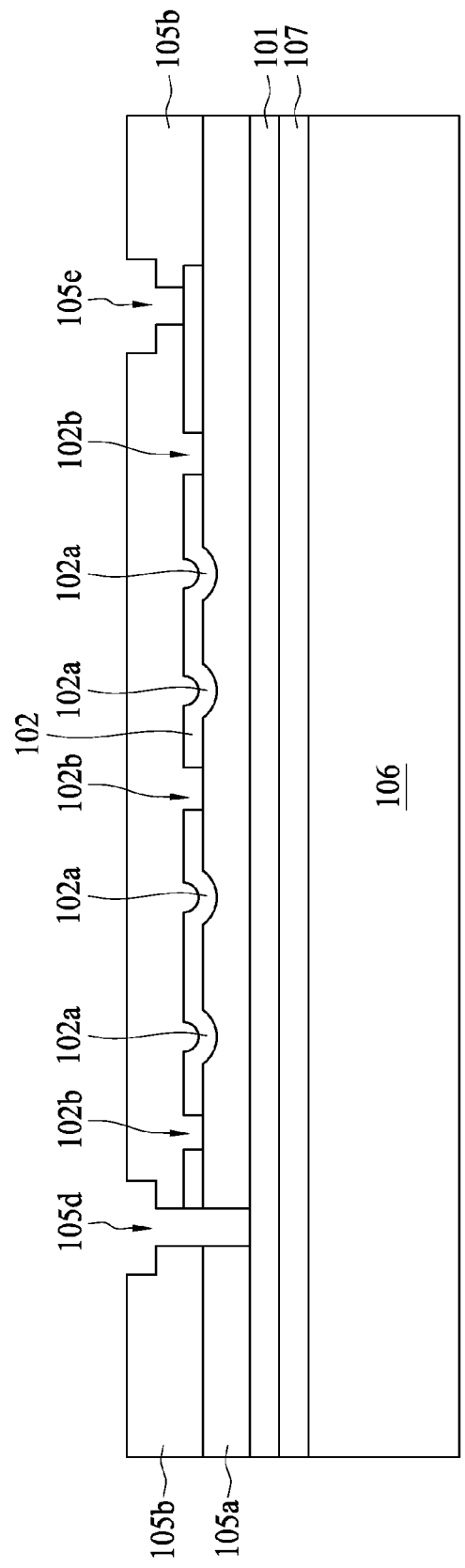
Figure 5I:
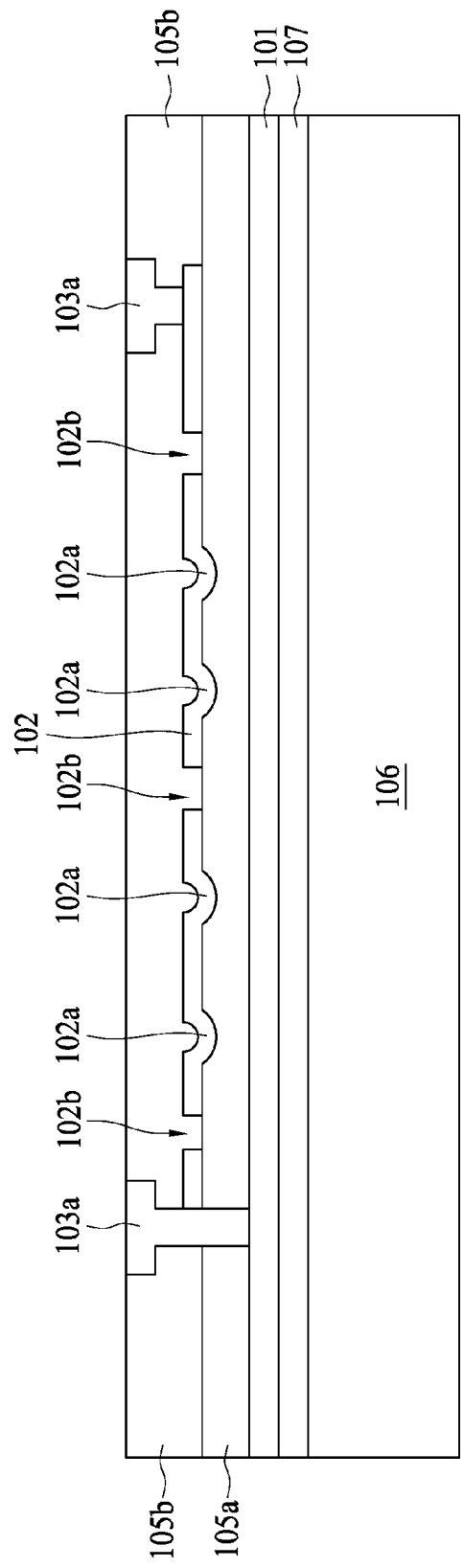

In operation 507, several a portion of conductor is formed as shown in FIGS. 5H and 5I. In some embodiments, several vias 105d passing through first sacrificial layer 105a or second sacrificial layer 105b are formed as shown in FIG. 5H. In some embodiments, vias 105d are formed by any suitable operation such as photolithography and etching. In some embodiments, first sacrificial layer 105a or second sacrificial layer 105b are partially removed and stopped at plate 101 to form vias 105d. In some embodiments, first sacrificial layer 105a or second sacrificial layer 105b are partially removed and stopped at membrane 102 to form vias 105e.

In some embodiments, vias 105d are deposited and filled by conductive materials such as copper to form conductive plugs (or first portion conductor) 103a as shown in FIG. 5I. In some embodiments, conductive plugs 103a pass through first sacrificial layer 105a or second sacrificial layer 105b. In some embodiments, conductive plug 103a is extended from plate 101 through the membrane 102. In some embodiments, conductive plug 103a is extended from or through membrane 102. In some embodiments, conductive plug 103a includes a silicide portion configured to provide an ohmic contact between plate 101 and metallic plug 103a.

In some embodiments, conductive plugs 103a are formed by partially removing first sacrificial layer 105a or second sacrificial layer 105b and then disposing copper. In some embodiments, first sacrificial layer 105a or second sacrificial layer 105b is partially removed by photolithography and etching operations. In some embodiments, copper is disposed by any suitable deposition operations. In some embodiments, conductive plug 103a has a height of about 1 um to about 50 um.

Figure 6:
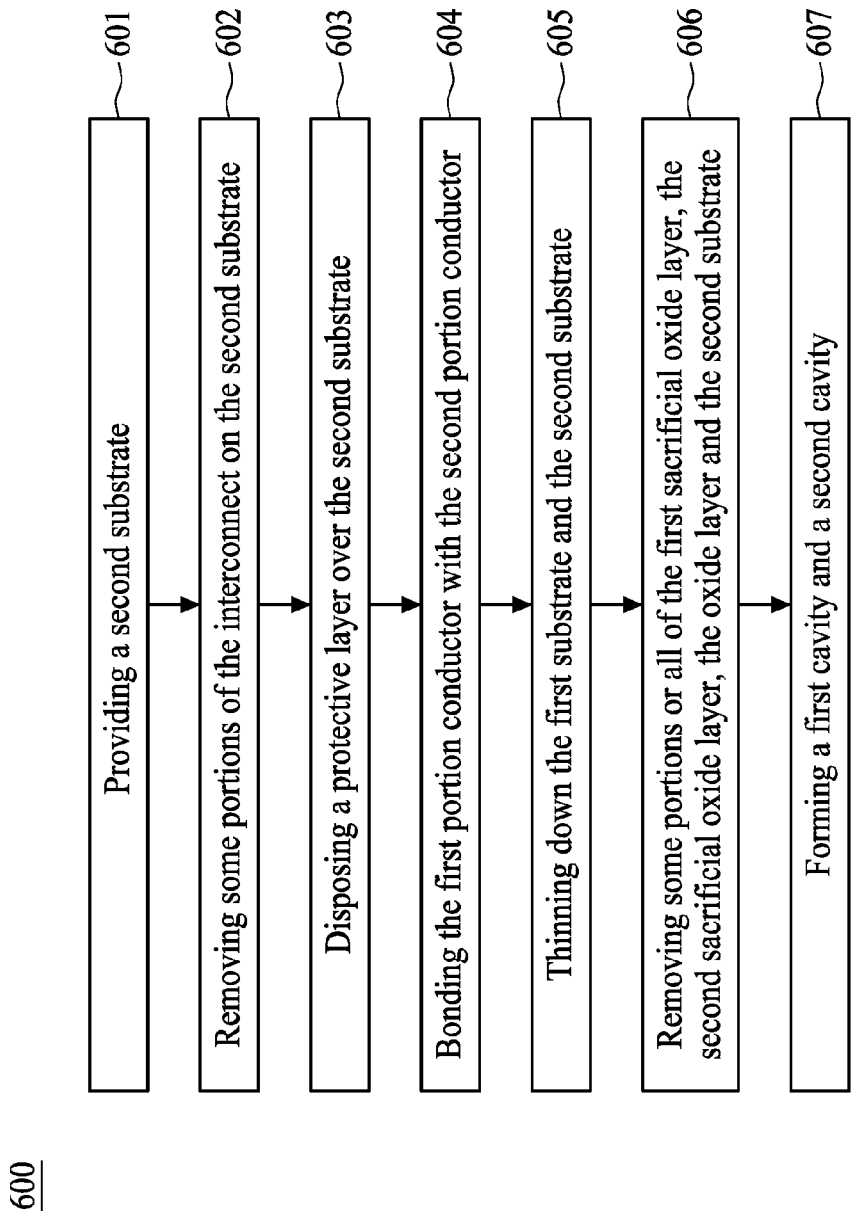
FIG. 6 is a flow diagram of a method of manufacturing a semiconductor device in accordance with some embodiments.
Figure 7A:
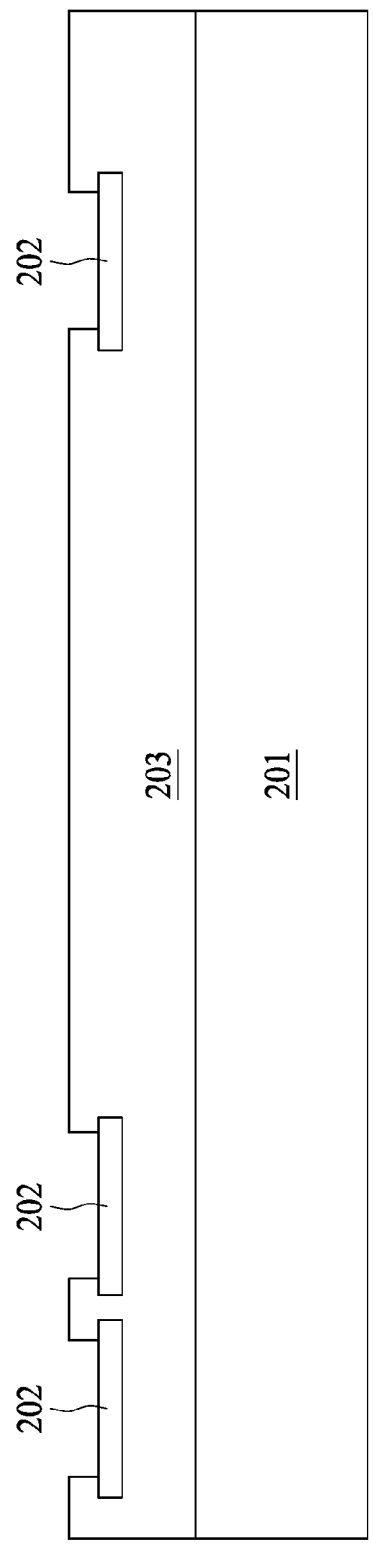
FIGS. 7A-7J are cross-sectional views of intermediate structures for a method of manufacturing a semiconductor device in FIG. 6, in accordance with some embodiments.

FIG. 6 is an embodiment of method 600 for manufacturing a portion of MEMS device 100. Method 600 includes a number of operations (601, 602, 603, 604, 605 and 606). In operation 601, second substrate 201 is provided or received as shown in FIG. 7A. In some embodiments, second substrate 201 includes several active devices such as CMOS devices. Second substrate 201 includes interconnect 203 disposed over second substrate 201 and several conductive pads 202 disposed in upper level of layer 203.

Figure 7B:
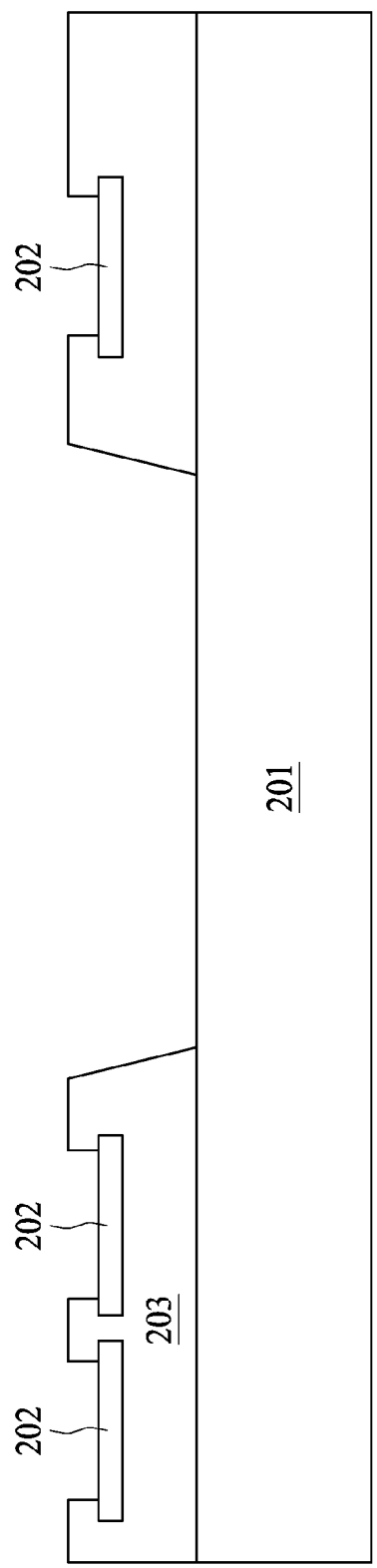

In operation 602, interconnect 203 is partially removed as shown in FIG. 7B. In some embodiments, layer 203 is partially removed by any suitable operations such as photolithography and etching.

Figure 7C:
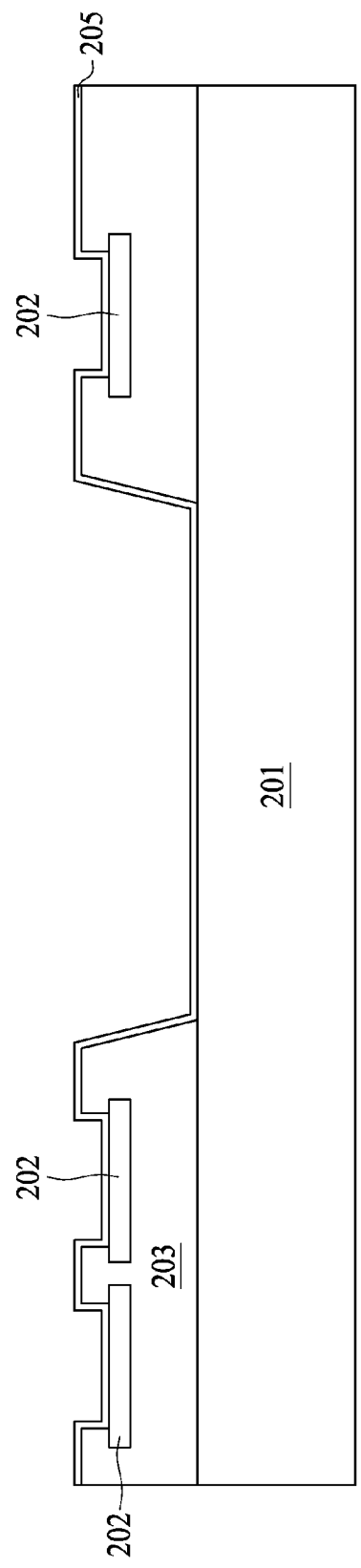

In operation 603, a protective layer 205 is disposed over interconnect 203, pads 202 and second substrate 201 as shown in FIG. 7C. In some embodiments, protective layer 205 is configured to prevent second substrate 201, layer 203, pad 202 or other components disposed over second substrate 201 from being etched or removed. In some embodiments, protective layer 205 is an etching stop layer to prevent second substrate 201 and the components disposed over second substrate 201 from being attacked by hydrofluoric acid vapor.

Figure 7D:
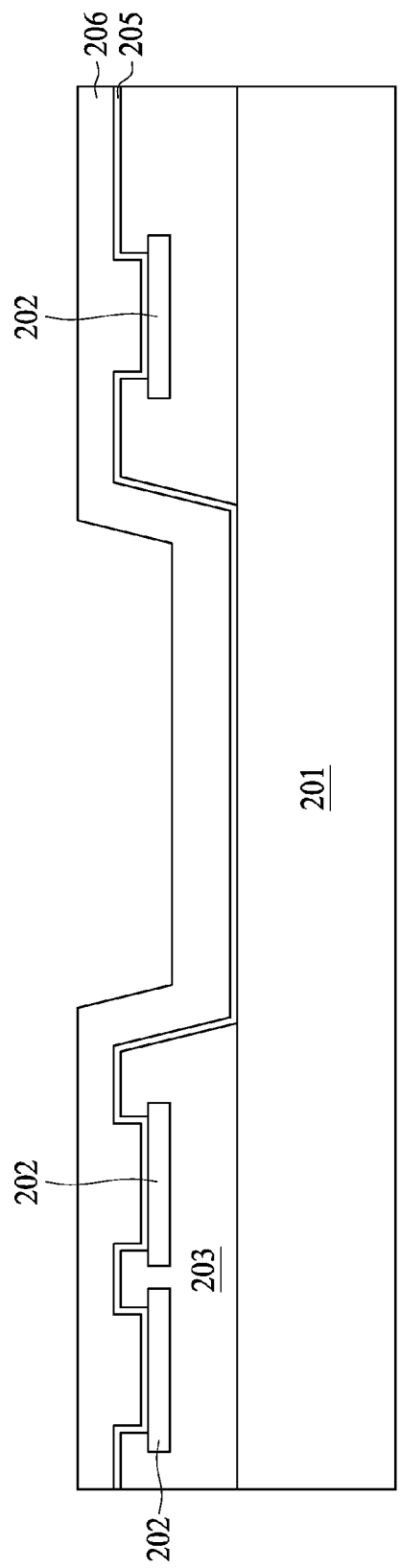
Figure 7E:
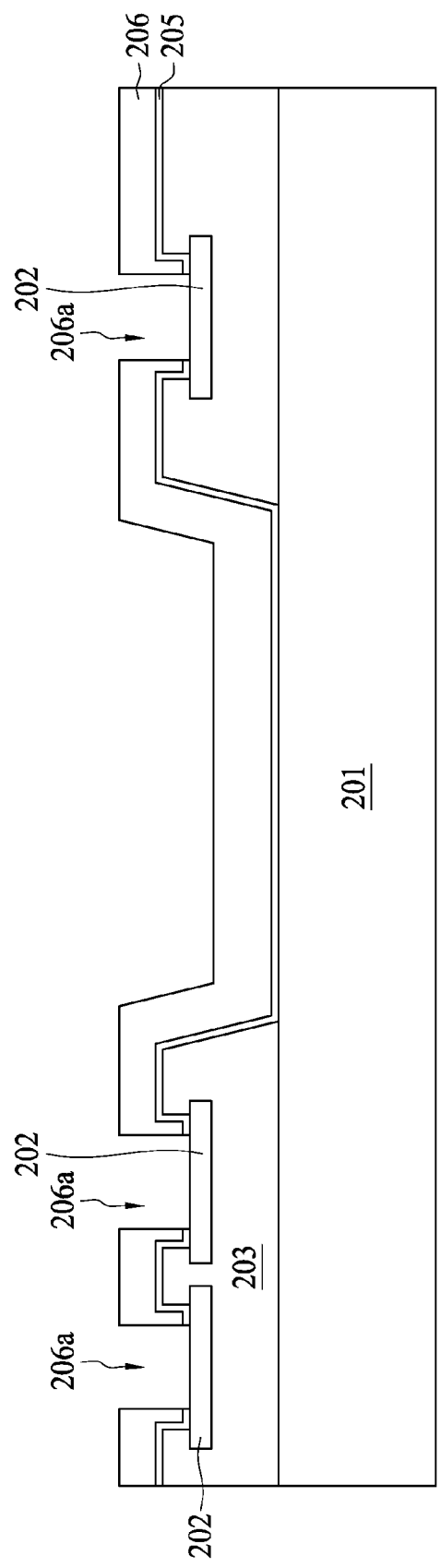

In some embodiments, an additional dielectric layer 206 is disposed over protective layer 205 as shown in FIG. 7D. In some embodiments, protective layer 205 and additional dielectric layer 206 disposed on pads 202 are removed as shown in FIG. 7E. Pads 202 are exposed from interconnect 203, protective layer 205 and through holes 206a in dielectric layer 206.

Figure 7F:
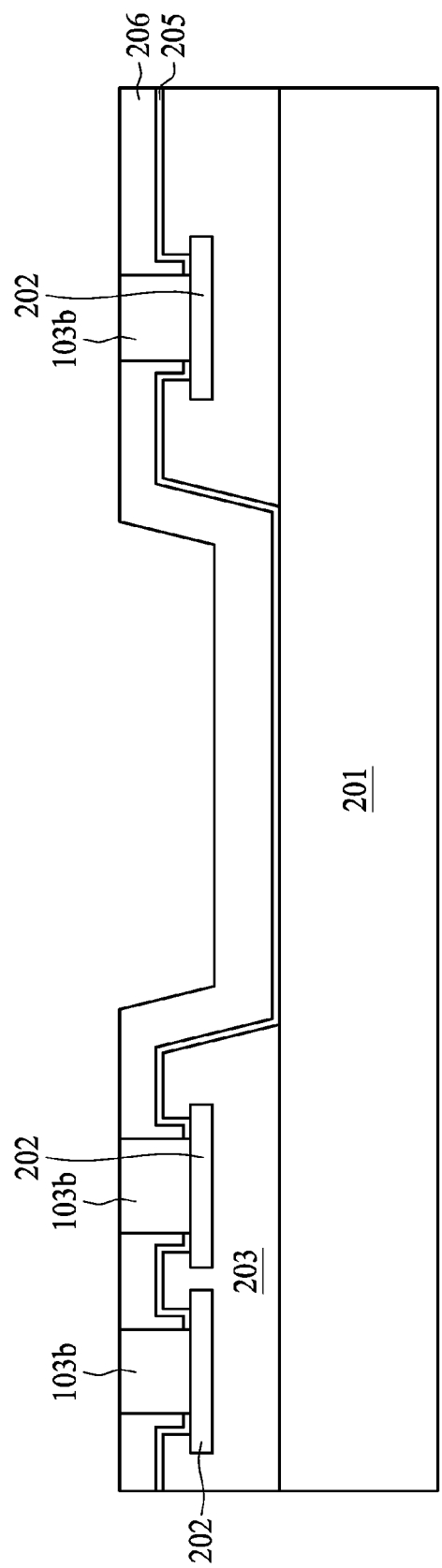

A conductive material is filled into through holes 206a as shown in FIG. 7F and forms second portion conductor 103b. Through holes 206a can be overfilled by the overlying section as mentioned is the description corresponding to FIG. 2.

Figure 7G:
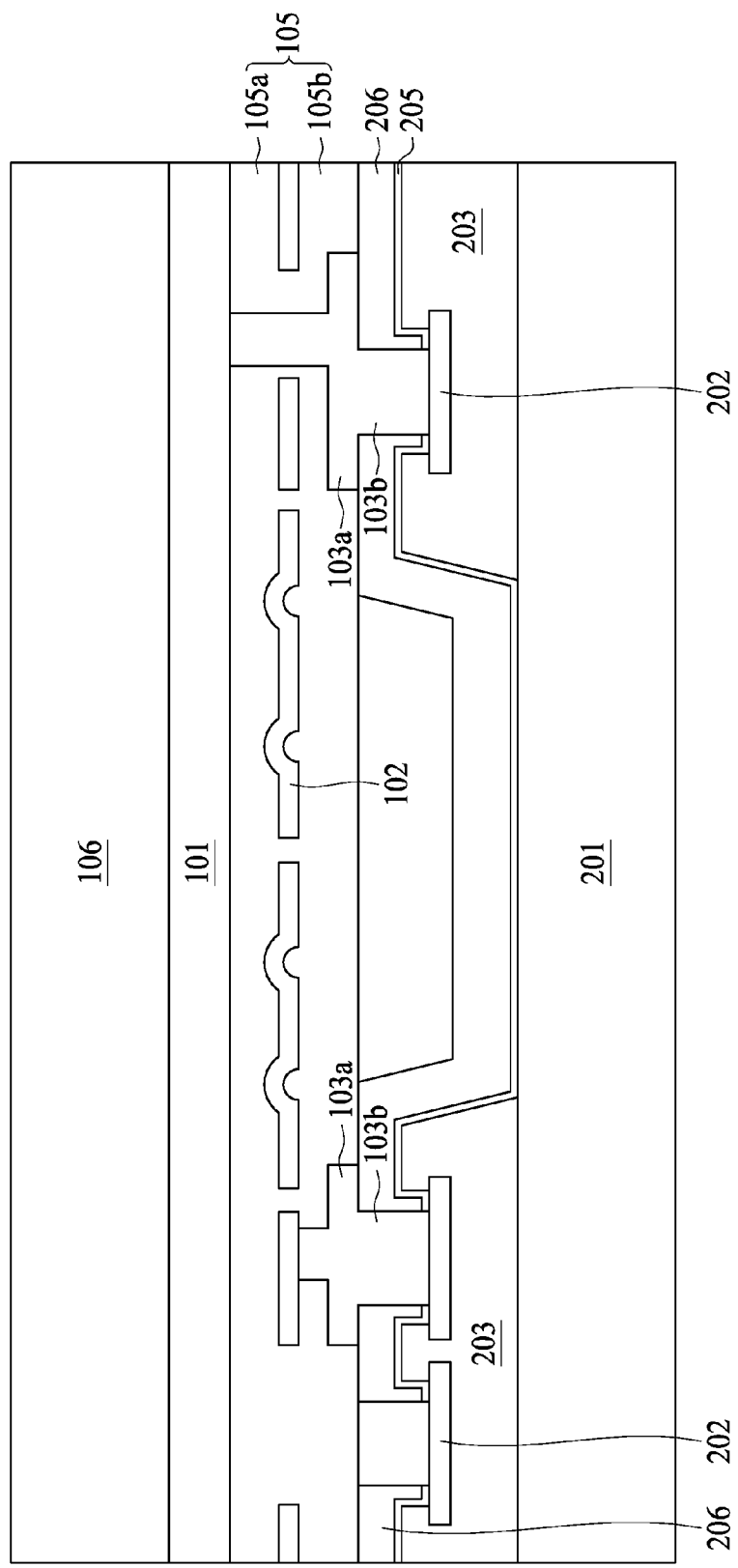

In operation 604, first substrate 106 is flipped so that first portion conductor 103a and second portion conductor 103b are bonded as shown in FIG. 7G.

Figure 7H:
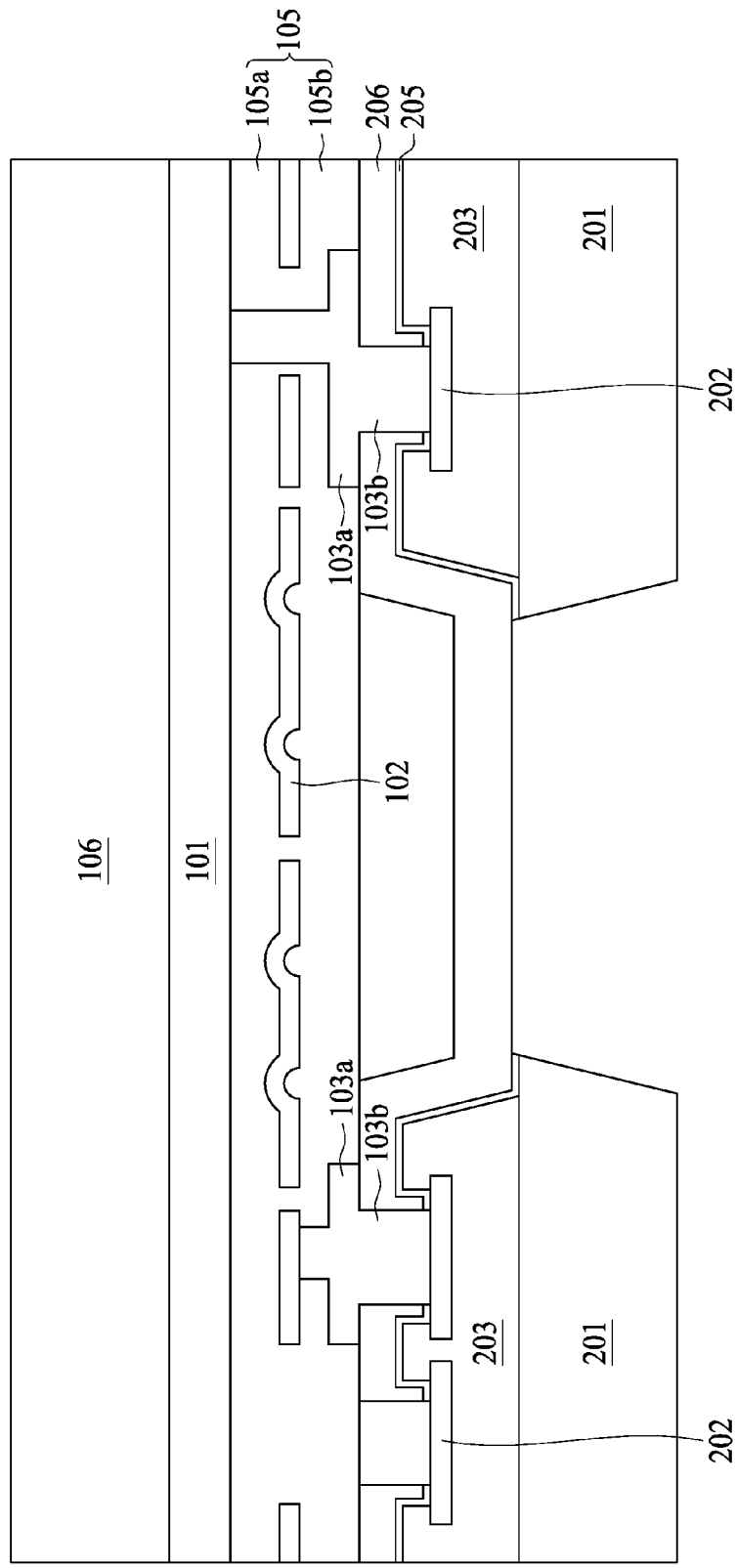
Figure 7I:
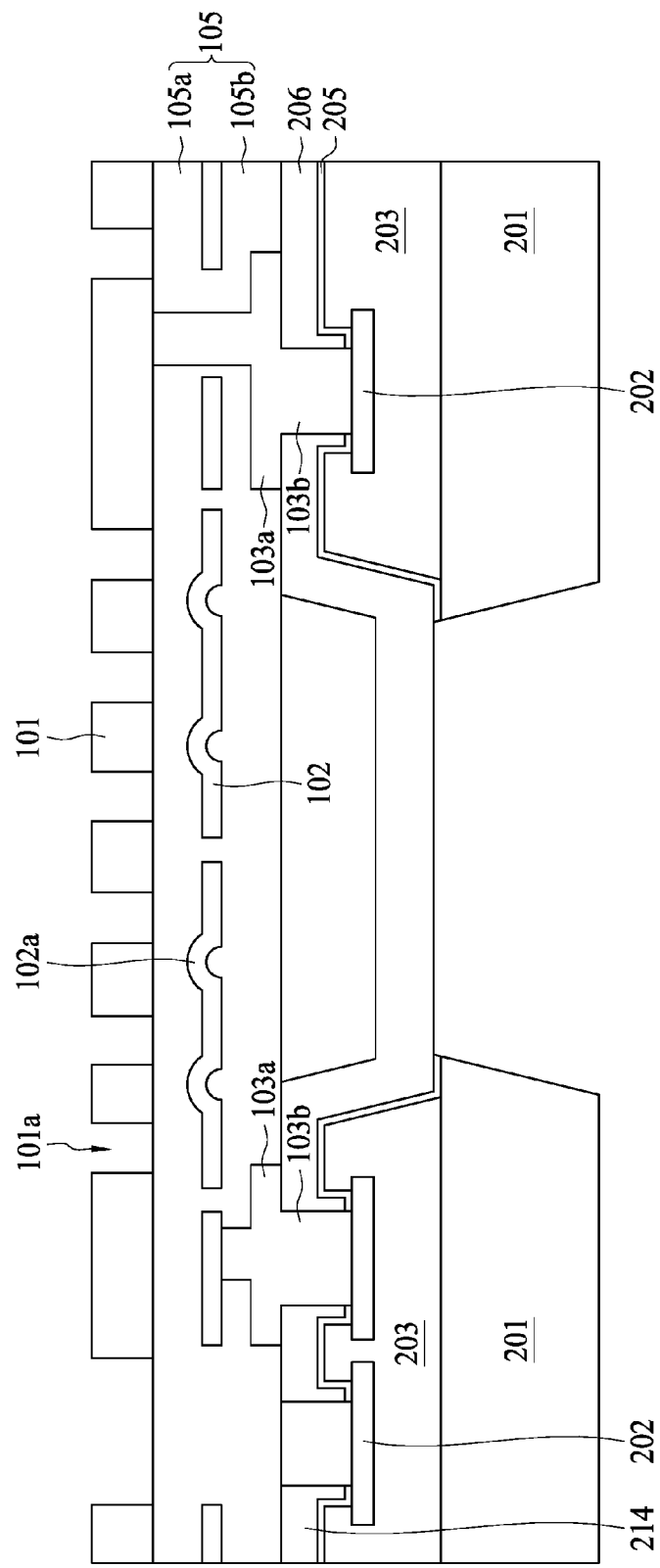

In operation 605, first substrate 106 and second substrate 201 are thinned down as shown in FIG. 7H. In some embodiments, first substrate 106 and second substrate 201 are thinned down by grinding operations. In some embodiments as shown in FIG. 7I, first substrate 106 is wholly or partially removed. In some embodiments, some portions or all of first substrate 106 are removed by grinding or etching operations. In some embodiments, first substrate 106 is thinned down or removed by dry or wet etching. In some embodiments, the dry or wet etching of first substrate 106 is stopped at plate 101. In some embodiments, second substrate 201 is thinned down from the thickness of about 800 um to about 100 um. In some embodiments, second substrate 201 is thinned down from the thickness of about 800 um to about 50 um.

Figure 7J:
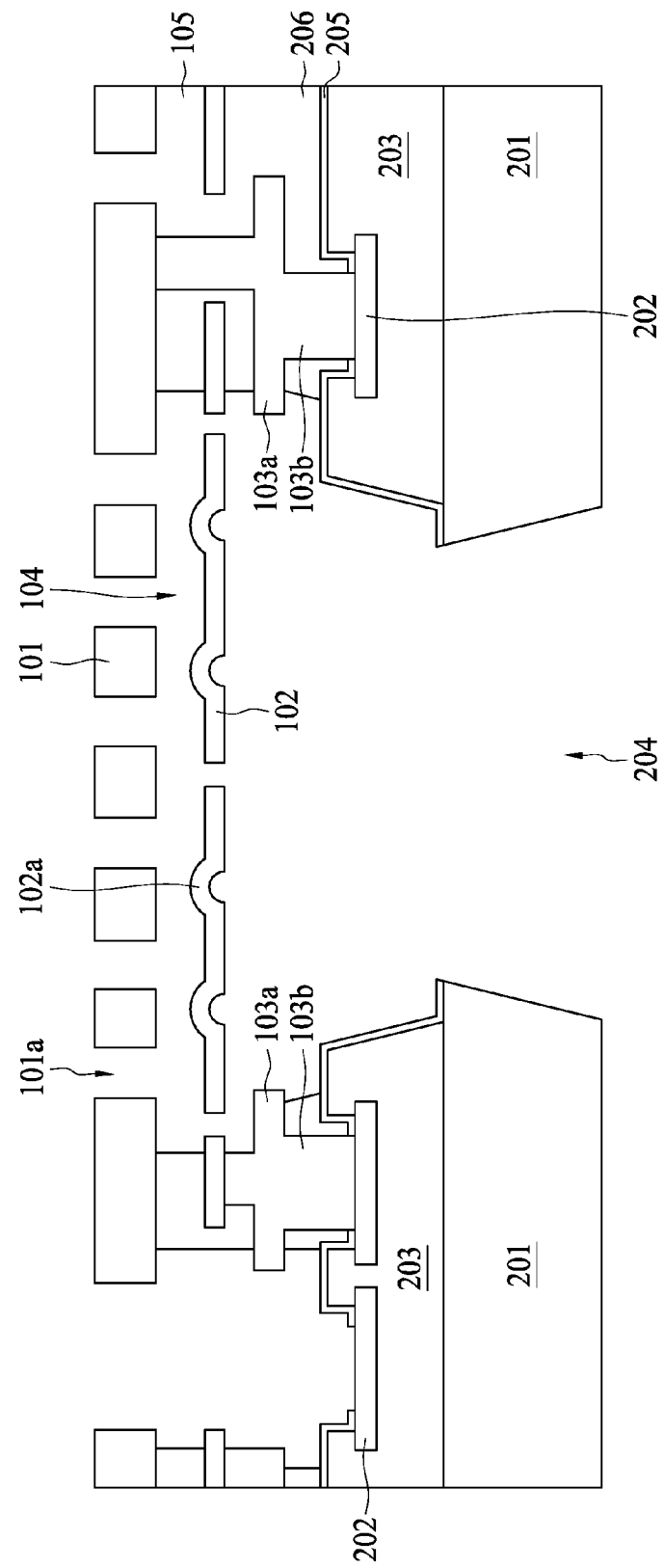

In operation 606, plate 101 is partially removed to have several through holes 101a as shown in FIG. 7I. In operation 607, a first cavity 104 is formed by partially removing first sacrificial layer 105a and second sacrificial layer 105b as in FIG. 7J. A second cavity 204 is formed as well by partially removing second substrate 201, protective layer 205, and layer 206. In some embodiments, second cavity 204 passes through second substrate 201 and layer 203. In some embodiments, second cavity 204 is aligned with first cavity 104. A monolithic MEMS device as shown in FIG. 2 is formed.

In the present disclosure a semiconductor device comprises a plate including a plurality of apertures. The semiconductor device also comprises a membrane disposed opposite to the plate and including a plurality of corrugations, a dielectric surrounding and covering an edge of the membrane, and a substrate. The semiconductor device further includes a metallic conductor comprising a first portion extending through the dielectric, and a second portion over the substrate, where the second portion is bonded with the first portion.

In the present disclosure a semiconductor comprises a monolithic sensor comprising a micro-electro mechanical system (MEMS) device and a complementary metal oxide semiconductor (CMOS) device. The MEMS device comprises a plate including a plurality of apertures. The MEMS device also includes a membrane disposed opposite to the plate and including a plurality of corrugations. The MEMS device further includes a first conductor disposed below the plate, and a first cavity between the plate and the membrane. Furthermore, the CMOS device comprises a substrate, an interconnect disposed over the substrate, and a second conductor electrically coupled to the interconnect and extruded from the interconnect toward the membrane. The first conductor is connected with the second conductor in a metal bond manner.

In the present disclosure a method of manufacturing a semiconductor structure comprises: providing a first substrate; disposing a plate over the first substrate; disposing a first sacrificial layer over the plate; forming a plurality of recesses over a surface of the first sacrificial layer; disposing and patterning a membrane over the first sacrificial layer; disposing a second sacrificial layer to surround the membrane and cover the first sacrificial layer; and forming a plurality of conductors passing through the second sacrificial layer or the membrane. A second substrate is provided. A protective is provided over the second substrate and a dielectric layer is provided over the protective layer. Second conductors are filled in holes through the dielectric layer. The first substrate is flipped and the conductors are bonded with second conductors. A first cavity is formed by partially removing the first sacrificial layer and the second sacrificial layer. A second cavity is formed by partially removing the second substrate, the protective layer, and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a plate including a plurality of apertures;
    a membrane disposed opposite to the plate and including a plurality of corrugations on a surface;
    a first dielectric surrounding and covering an edge of the membrane;
    a substrate;
    a second dielectric between the substrate and the first dielectric; and
    a metallic conductor, comprising
        a first portion extending through the first dielectric along a first central axis of the first portion; and
        a second portion over the substrate, an end of the second portion extending through the second dielectric along a second central axis of the end, wherein the second portion is bonded with the first portion and the second central axis is offset from the first central axis.

2. The semiconductor device of claim 1, wherein the membrane is configured to be displaceable relative to the plate.

3. The semiconductor structure of claim 1, wherein the membrane is within a cavity defined by the plate and the membrane.

4. The semiconductor structure of claim 1, wherein the first portion conductor includes one of gold, tin, silicon, copper and tin copper alloy.

5. The semiconductor structure of claim 1, wherein the second portion conductor includes one of gold, tin, silicon, copper and tin copper alloy.

6. The semiconductor structure of claim 1, wherein the membrane is sensitive to an acoustic pressure.

7. The semiconductor structure of claim 1, wherein the first portion conductor is electrically coupled to the membrane.

8. The semiconductor structure of claim 1, wherein the plate comprises a silicon-on-insulator layer, polysilicon, oxide, or epitaxial silicon.

9. The semiconductor structure of claim 1, wherein the second portion conductor is configured as a loop.

10. The semiconductor structure of claim 1, wherein each of the plurality of corrugations is protruded from membrane and toward the plate.

11. A monolithic sensor, comprising:
a micro-electro mechanical system (MEMS) device comprising:
a plate including a plurality of apertures;
a membrane disposed opposite to the plate and including a plurality of corrugations;
a first conductor disposed below the plate and extending along a first central axis of the first conductor; and
a first cavity between the plate and the membrane; and
a complementary metal oxide semiconductor (CMOS) device comprising:
a substrate;
an interconnect disposed over the substrate and
a second conductor electrically coupled to the interconnect and extruded from the interconnect toward the membrane along a second central axis of the second conductor, wherein the first conductor is connected with the second conductor in a metal bond manner and the first central axis is in parallel but not aligned with the second central axis.

12. The monolithic sensor of claim 11, wherein a total thickness from the MEMS to the CMOS device is less than about 200 um.

13. The monolithic sensor of claim 11, wherein the plate is stationary and the membrane is movable within the first cavity and relative to the plate.

14. The monolithic sensor of claim 11, wherein the MEMS device includes a dielectric disposed around a peripheral portion of the membrane.

15. The monolithic sensor of claim 11, wherein the CMOS device includes a dielectric between the interconnect and the first conductor, wherein a portion of the second conductor is partially interposed between the interconnect and the first conductor.

16. The monolithic sensor of claim 11, wherein the plate has a thickness of about 0.3 um to about 50 um.

17. The monolithic sensor of claim 11, wherein the plate is disposed away from the membrane in a distance of about 0.1 um to about 5 um.

18. A semiconductor device, comprising:
a plate including a plurality of apertures;
a movable membrane including a plurality of corrugations;
a first cavity between the plate and the movable membrane;
a substrate;
a first dielectric between the plate and the substrate;
a metallic conductor, comprising
a first portion being in contact with the first dielectric; and
a second portion over the substrate, wherein the second portion is bonded with the first portion, wherein a central axis shared by the first portion and the second portion staggers conformally to the first portion and the second portion.

19. The semiconductor device of claim 18, wherein a sidewall of the first portion is partially exposed from the first dielectric.

20. The semiconductor device of claim 18, further comprising a second dielectric between the substrate and the first dielectric, wherein the second portion is surrounded by the second dielectric.

* * * * *